United States Patent [19]

Chevillat et al.

[11] Patent Number: 5,031,195
[45] Date of Patent: Jul. 9, 1991

[54] FULLY ADAPTIVE MODEM RECEIVER USING WHITENING MATCHED FILTERING

[75] Inventors: Pierre R. Chevillat, Kilchberg; Evangelos Eleftheriou, Zurich, both of Switzerland

[73] Assignee: International Business Machines Corporation, Armonk, N.Y.

[21] Appl. No.: 361,174

[22] Filed: Jun. 5, 1989

[51] Int. Cl.$^5$ .......................................... H03H 07/30
[52] U.S. Cl. ........................................ 375/14; 375/99; 364/724.2
[58] Field of Search ................. 375/8, 34, 13, 14, 99, 375/11, 57; 364/724.2

[56] References Cited

U.S. PATENT DOCUMENTS

| | | | |
|---|---|---|---|
| 4,320,526 | 3/1982 | Gitlin | 375/14 X |
| 4,462,108 | 7/1984 | Miller | 375/13 X |
| 4,631,735 | 12/1986 | Qureshi | 375/14 X |
| 4,833,693 | 5/1989 | Gyuboglu | 375/99 X |
| 4,847,880 | 7/1989 | Kamerman et al. | 375/13 X |

OTHER PUBLICATIONS

P. R. Chevillat and E. Eleftheriou, "Decoding of Trellis-Encoded Signals in the Presence of Intersymbol Interference and Noise", IEEE Communications Society, IEEE International Conference on Communications, Jun. 12-15, 1988, pp. 0694-0699.

Primary Examiner—Benedict V. Safourek
Assistant Examiner—Tesfaldet Bocure
Attorney, Agent, or Firm—Edward H. Duffield

[57] ABSTRACT

Fully adaptive modem receiver for data-transmission systems which use trellis-coded modulation (TCM) and comprises an adaptive whitened-matched filter (WMF) and a reduced-state trellis decoder. The WMF consists of an adaptive linear equalizer with fractional-T spaced coefficients, and an adaptive linear predictor. The decoder combines the functions of equalization and TCM decoding. It employs combined intersymbol interference (ISI) and code states which exploit the set-partitioning structure of the underlying TCM code to provide full or reduced-state information about past ISI terms. The decoder branch metric cancels those ISI terms that are not, or are only partially, represented by the trellis states.

10 Claims, 12 Drawing Sheets

FULLY ADAPTIVE MODEM RECEIVER USING WHITENING MATCHED FILTERING

FIELD OF THE INVENTION

The present invention relates to modems, and relates particularly to a new fully adaptive receiver of a modem, using whitening matched filtering. The invention is well adapted to be implemented with a trellis decoder combining the functions of equalization and Trellis-coded modulation decoding.

BACKGROUND ART

The receivers for voice-band modems employing Trellis-coded modulation (TCM), as described in the Article "channel coding with multi-level/phase signals" by G. Ungerboeck, published in IEEE Trans. Inform. Theory, vol. IT-28, January 1982, typically use a linear equalizer followed by a separate soft-decision Viterbi decoder which determines the coded sequence closest in Euclidean distance to the equalizer output samples. For channels with severe amplitude distortion, linear equalization leads to a substantial noise enhancement. In principle, this noise enhancement can be reduced by using a decision-feedback equalizer (DFE) in front of the TCM decoder. The feedback section of the equalizer subtracts the intersymbol interference (ISI) caused by symbols detected previously as described in the Article "Adaptive equalization" by S. Qureshi, published in Proc. IEEE, vol. 73, September 1985, provided correct decisions are available with delay zero. However, since zero-delay tentative decisions obtained from the TCM decoder are not reliable, the performance improvement is marginal.

The optimum receiver for estimating an uncoded data sequence in the presence of ISI and additive white-Gaussian noise consists of a whitened-matched filter followed by a Viterbi decoder which performs maximum-likelihood sequence decoding on the ISI trellis, as described in the Article "Maximum-likelihood sequence estimation of digital sequences in the presence of intersymbol interference" by G. Forney, published in IEEE Trans. Inform. Theory, vol. IT-18, May 1972. The state complexity of this trellis is given by $2^{mL}$, where L represents the number of relevant ISI terms in the output signal of the WMF, and m denotes the number of transmitted bits per data symbol. The sizable complexity of such a receiver for channels where L is large led to the development of prefiltering and channel truncation techniques which shape the channel response to a desired one of acceptably short duration.

In the Article "Adaptive channel memory truncation for maximum likelihood sequence estimation" by D. Falconer and F. Magee, published in Bell System Technical Journal, vol. 52, November 1973, a joint optimization of the desired impulse response and a linear prefilter have been investigated. In the Article "A maximum-likelihood sequence estimator with decision-feedback equalization" by W. Lee and F. Hill, published in IEEE Trans. Commun, vol. COM-25, September 1977, a decision-feedback equalizer (DFE) has been proposed instead of a linear prefilter. The error propagation effect of the DFE prefilter can then be mitigated by incorporating a decision-feedback mechanism into the sequence estimator.

Other suboptimum approaches have been studied which reduce complexity by simplifying the Viterbi decoder itself. For example, in the Article "Reduced-state Viterbi decoders for channels with intersymbol interference" by F. Vermeulen and M. Hellman, published in Conf. Rec. ICC'74, Minneapolis, June 1974, a reduced-state decoder is presented where only a certain number of survivor paths are retained. Also, it has recently been shown in the Article "Reduced-state sequence estimation with set-partitioning and decision-feedback" by V. Eyuboglu and S. Qureshi, published in IEEE Trans. Commun. vol COM-36, January 1988, that partial representation of ISI terms using the set-partitioning allows a further reduction of the state complexity.

SUMMARY OF THE INVENTION

It is therefore the object of the invention to provide a general approach which treats the subjects of TCM decoding and sequence estimation in the presence of ISI jointly. Using ISI-state truncation techniques, and applying the set-partitioning inherent to TCM, a new fully adaptive modem receiver is then disclosed for reducing the state complexity of the combined ISI and code trellis. The number of states of this reduced-state trellis depends on the constraint length of the trellis code, the channel truncation length, and the depth of set partitioning of the input signal alphabet. ISI terms which are not represented by the combined ISI and TCM states are subtracted by a modified decoder metric which incorporates an ISI-cancelation mechanism. A family of Viterbi decoders is thus obtained which combine the previously separated functions of equalization and decoding and offer a trade-off between decoding complexity and performance.

The fully adaptive modem receiver of the invention comprises a fractional-tap spacing equalizer receiving as input the components r(t) of the demodulated received signal and having coefficients $C_i$ (i from 0 to Nk−1) spaced at intervals T/k where k>1 is a small integer, and a sequence decoder for determining the coded data bit sequence closest in Euclidian distance to samples at the input of the decoder. Such a receiver is characterized in that it comprises a linear predictor having coefficients $P_i$ (i from 1 to L) which, in response to the samples $V_n$ from the equalizer, provides an output value $$\sum_{i=1}^{L} P_i \cdot V_{n-i},$$

an adder for adding the predictor output value to the sample $V_n$ and providing a resulting signal $Z_n$ to the sequence decoder, and adapting means providing, in response to known reference symbols or zero-delay tentative decision from the sequence decoder, an adapting signal enabling the coefficients $P_i$ of the predictor to be updated, whereby the noise at the input of the sequence decoder is whitened regardless of whether the additive channel noise is correlated or not.

BRIEF DESCRIPTION OF THE DRAWINGS

Details of the invention will be more ascertained in the following description in reference to the accompanying drawings wherein.

DETAILED DESCRIPTION

Figure 1:
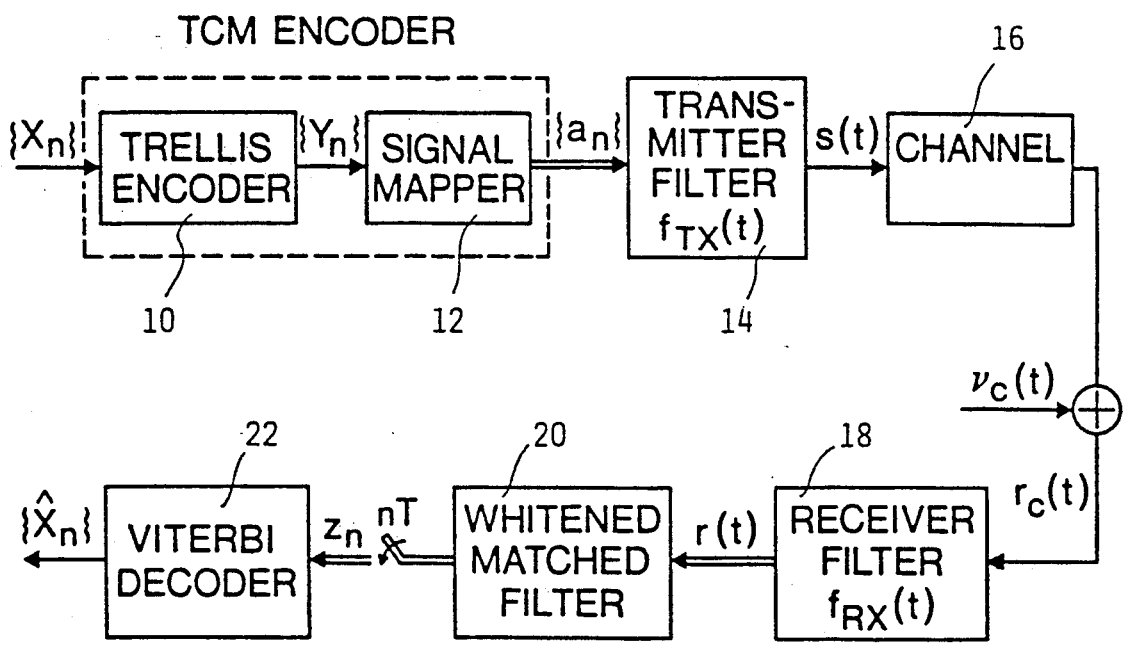
FIG. 1 is a block-diagram showing a transmission system with the adaptive modem receiver according to the invention.

A block diagram of a transmission system including a transmitting modem and a receiving modem according to the invention is shown on FIG. 1. Assuming that m information bits $X_n$ per signaling interval are transmitted. The trellis encoder 10 produces $m+1$ encoded bits $Y_n$ which are assigned to a symbol $a_n$ taken from a $2^{m+1}$-ary signal constellation in the signal mapper 12. The transmitter then produces a pulse-amplitude modulation signal of the form $$s(t) = Re\left\{ \sum_n a_n f_{TX}(t - nT) \right\}, \quad (1)$$

where $f_{TX}(t)$ denotes the complex impulse response of the passband transmitter filter 14 and $1/T$ is the symbol rate.

The receiver observes the real signal $r_c(t)$ emerging from a linear dispersive channel 16 (e.g. the telephone line) which adds Gaussian noise $v_c(t)$. A Hilbert filter 18 with impulse response $f_{RX}(t)$ reconstructs an analytic passband signal $$r(t) = \sum_n a_n h(t - nT) + v(t), \quad (2)$$

where the complex impulse response $h(t)$ accounts for transmitter, channel, and receiver filters, and $v(t)$ represents complex zero-mean Gaussian noise in the bandwidth of interest. The output of the Hilbert filter enters a passband whitened-matched filter 20 which decorrelates the noise while achieving the best possible signal-to-noise ratio. Finally, the sampled signal $Z_n$ is fed to the Viterbi decoder 22 which outputs the decision $X_n$.

Figure 2:
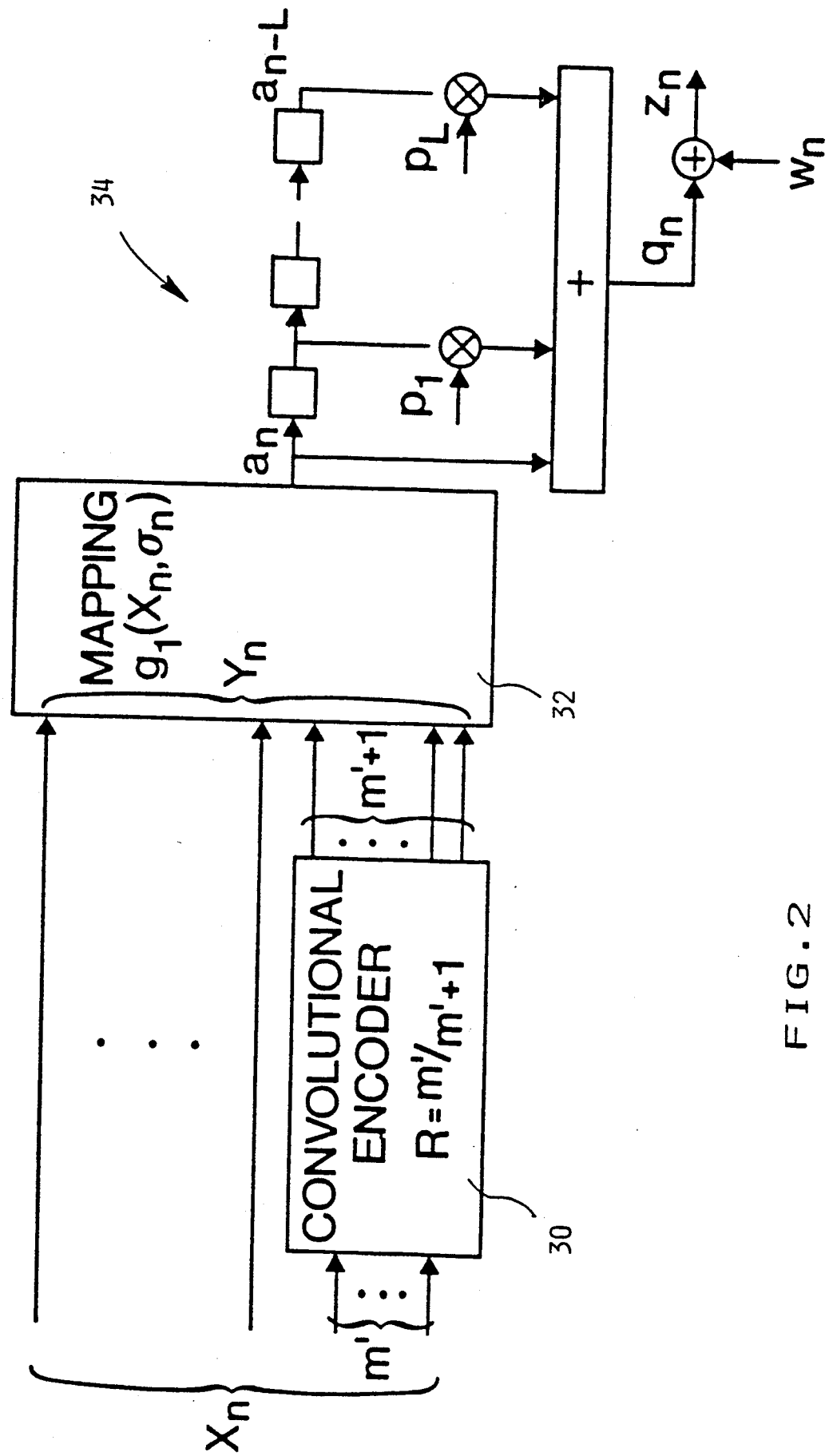
FIG. 2 is a block-diagram depicting a discrete-time model of the transmitting part of a transmission system incorporating the receiver of the invention.

Consider now the discrete-time model of the transmitting part of the system including the transmitting modem and the channel, shown on FIG. 2. Such a model consists of a TCM encoder followed by a minimum-phase transversal filter 34 with L coefficients $\{1, P_1, \ldots, P_L\}$, where without loss of generally $P_0 = 1$ has been assumed. The rate-$m'/(m'+1)$ convolutional encoder 30 operates on $m' \leq m$ input bits and produces $m'+1$ encoded bits. The $m+1$ uncoded and coded bits $Y_n$ are subsequently mapped, in mapping block 32 into the complex symbol $a_n$. Hence, the transmitted data symbol is a function of the encoder state $\sigma_n$ and the information bits $X_n$ at time n, i.e., $$a_n = g_1(X_n, \sigma_n), \quad (3)$$

while $$\sigma_{n+1} = g_2(X_n, \sigma_n) \quad (4)$$

describes the state transition of the encoder. The discrete-model output sample $q_n$ is given by $$q_n = a_n + u_n, \quad (5)$$

where $$u_n = \sum_{i=1}^{L} P_i a_{n-1} \quad (6)$$

describes the ISI at the output of the transversal filter. The decoder then observes the signal $$Z_n = q_n + W_n, \quad (7)$$

where $w_n$ represents the whitened noise. FIG. 2 suggests the view of a combined finite-state machine whose states are given by $$\mu_n = (a_{n-L}, a_{n-L+1}, a_{n-1}, \sigma_n), \quad (8)$$

where the symbol sequence $\{a_{n-L}, a_{n-L+1}, \ldots, a_{n-1}\}$ corresponds to a path which takes the TCM encoder from a previous sate $\sigma_{n-L}$ to the present state $\sigma_n$ in compliance with the TCM coding rule. A transition of the finite-state machine from state $\mu_n$ to state $\mu_{n+1}$ is:

$$\mu_n : a_n \rightarrow \mu_{n+1}, \quad (9)$$

where $a_n$ denotes a symbol allowed by the TCM coding rule. Equivalently, the combined state can be expressed in terms of the sequence of symbol labels $\{Y_{n-L}, Y_{n-L+1}, \ldots Y_{n-1}\}$ as $$\mu_n = (Y_{n-L}, Y_{n-L+1}, \ldots Y_{n-1}; \sigma_n), \quad (10)$$

or in terms of the information sequence $\{X_{n-L}, X_{n-L+1}, \ldots, X_{n31\ 1}\}$ as $$\mu_n = (\sigma_{n-L}; X_{n-L+1}, \ldots, X_{n-1})$$

The finite-state machine view of the encoder and discrete channel leads to a combined ISI and code trellis. Associated with each code state are $2^{mL}$ ISI states. Hence, in the case of an S-state TCM encoder and a signal constellation with $W = 2^{m+1}$ points, the combined trellis has $S(W/2)^L$ states with $W/2$ transitions emerging from each state.

DECODER STRUCTURE

The optimum decoder for trellis-encoded data signals in the presence of additive white-gaussian noise determines the coded sequence $\{\hat{a}_n\}$ which is closed in Euclidian distance to the sequence $\{z_n\} = \{a_n + w_n\}$. This is accomplished by a soft decision Viterbi decoder which recursively minimizes the metric $$M_n(\ldots a_n) = M_{n-1}(\ldots a_{n-1}) + |z_n - a_n|^2 \quad (12)$$

over all the code sequences $\{a_n\}$.

In the presence of ISI and whitened noise, the optimum decode determines the TCM-coded sequence $\{\hat{a}_n\}$ which is closest to the sequence $\{z_n\} = \{a_n + u_n + w_n\}$.

This is achieved by a Viterbi decoder which operates on the combined ISI and code trellis and minimizes the metric $$M_n(\ldots a_n) = M_{n-1}(\ldots a_{n-1}) + \left| z_n - \sum_{i=1}^{L} P_i a_{n-i} - a_n \right|^2, \quad (13)$$

which takes into account the ISI due to past symbols $\{a_n\}$.

The computation and storage requirements of the optimum decoder grow exponentially with the channel memory L, rendering its implementation unrealistic even for moderate values of S and W. Decoder complexity can be reduced by truncating the effective channel memory to K terms. A suboptimum Viterbi decoder is thus obtained which operates on a reduced number of combined ISI and code states. Truncating the channel memory leads to a combined trellis whose states are defined by $$\mu_n^K = (a_{n-K}, a_{n-K+1}, \ldots, a_{n-1}, \sigma_n), \quad (14)$$

where $0 \leq K \leq L$ and $$\mu_n^0 = \sigma_n. \quad (15)$$

In order to alleviate the resulting performance degradation, an ISI-cancelation mechanism is introduced into the branch metric computation. In particular, ISI terms not represented by the truncated combined state of (14) are estimated and subtracted by the metric computation using information on past symbols taken from the past history of the decoder.

Associated with each truncated combined state $\mu_n^K$ there is a unique path of history of symbol estimates $\{\ldots, \hat{a}_{n-K-2}(\mu_n^K), \hat{a}_{n-K-1}(\mu_n^K)\}$, and a corresponding survivor path metric defined as $\tilde{M}_{n-1}(\mu_n^K)$. The decoder computes the survivor path metric recursively according to $$\tilde{M}_n(\mu_{n+1}^K) = \min \left( \tilde{M}_{n-1}(\mu_n^K) + \left| z_n - \sum_{i=K+1}^{L} P_i \hat{a}_{n-i}(\mu_n^K) - \sum_{i=1}^{K} P_i a_{n-i} - a_n \right|^2 \right), \{\mu_n^K\} \to \mu_{n+1}^K \quad (16)$$

where the minimization is taken over all trellis branches originating from states $\{\mu_n^K\}$ and leading to successor state $\mu_{n+1}^K$. The notation $\hat{a}_{n-i}(\mu_n^K)$ emphasizes that the ISI terms due to symbols $\{a_{n-i}\}$, $K+1 \leq i \leq L$, which are not represented by the truncated state $\mu_n^K$, are estimated using decisions taken from the path history associated with predecessor state $\mu_n^K$.

Expression (16) gives rise to a family of Viterbi decoders which simultaneously perform equalization and TCM decoding. The state complexity of these decoders is given by $S(W/2)^K$, where K represents the effective channel memory length handled by the Viterbi algorithm. For $K = L$, (16) leads to the optimum MLSD receiver. For $K < L$, the decoder operates on a subset of all combined TCM and ISI states. At the same time, it compensates in a decision-feedback fashion the L-K ISI terms not represented by the truncated combined state of (14). Note that the ability of the decoder to cancel this residual ISI crucially depends on computing the second term of the branch metric in (16) separately for each hypothesized path.

An interesting special case arises when $K = 0$. Setting $K = 0$ in (16) and observing (15) leads to $$\tilde{M}_n(\sigma_{n+1}) = \min \left( \tilde{M}_{n-1}(\sigma_n) + \left| z_n - \sum_{i=1}^{L} P_i \hat{a}_{n-i}(\sigma_n) - a_n \right|^2 \right), \{\sigma_n\} \to \sigma_{n+1} \quad (17)$$

where the minimization is taken over all trellis branches originating from code states $\{\sigma_n\}$ and leading to the successor state $\sigma_{n+1}$. The Viterbi decoder thus operates directly on the TCM code trellis. It is interesting to note that the L ISI terms are canceled in a way reminiscent of a decision-feedback equalizer in cascade with a TCM Viterbi decoder. However, because the modified branch metric in (17) uses the corresponding decoder symbol decisions from each hypothesized survivor path, the error propagation effects of the equalizer are avoided.

For a large signal constellations, the state complexity of the decoder is substantial even if the channel memory is truncated to $K = 1$. A further reduction of the number of combined ISI and code states can be achieved by employing the ideas of set partitioning. We define combined ISI and code states using the subset partitioning inherent in TCM transmission schemes. This approach leads to reduced-state combined trellises whose state complexity is independent of the size of the signal constellation W. Only the number of parallel transitions in the combined ISI and code trellis is affected by W. Consider again the case of transmitting m information bits per signaling interval using a rate-$m'/(m'+1)$ encoder. In every symbol interval n, the $m+1$ bit label $Y_n = (Y_n^0, Y_n^1, \ldots, Y_n^m)$ selects a unique member of the $2^{m+1}$-ary signal constellation in accordance with the mapping rule. Note that bit $Y_n^0$ represents the B-type subset of $a_n$, $Y_n^1$ the C-type subset, and so forth until the subsets are decomposed into single data points. Correspondingly, for each symbol $a_{n-i}$ within the span of the truncated channel memory K, the $m_i + 1$ bit label $$Y_{n-i}(m_i) = (Y_{n-i}^0, Y_{n-i}^1, \ldots, Y_{n-i}^{m_i}), \quad (18)$$

where $m_i \leq m$, $1 \leq i \leq K$, characterizes the depth of set partitioning as well as the position of the subset in the partition tree to which symbol $a_{n-i}$ belongs. Apparently, if $m_i = m'$, the depth of subset partitioning used by the TCM encoder is obtained.

Given the encoder state $\sigma_n$ and a label sequence $\{Y_{n-K}(m_K), Y_{n-K+1}(m_K-1), \ldots, Y_{n-1}(m_1)\}$, the encoder state $\sigma_{n-K}$ at time n-K can be uniquely determined if $m' \leq m_i \leq m$ for all i, $1 \leq i \leq K$. The number of combined ISI and code states can therefore be reduced by associating with each code state $\sigma_n$ the label sequence $\{Y_{n-K}(m_K), Y_{n-K+1}(m_K-1), \ldots, Y_{n-1}(m_1)\}$. This suggests the view of a reduced combined state given by $$\lambda_n^K = (Y_{n-K}(m_K) \ldots, Y_{n-1}(m_1); \sigma_n). \quad (19)$$

Equivalently, using the corresponding information sequence $\{X_{n-K}(m_K), X_{n-K+1}(m_{K-1}), \ldots, X_{n-1}(m_1)\}$, where $$X_{n-i}(m_i) = (x_{n-i}^1, \ldots, x_{n-i}^{m_i}), \quad (20)$$

the reduced combined state can be expressed as $$\lambda_n^K = (\sigma_{n-K}; X_{n-K}(m_K), \ldots, X_{n-1}(m_1)). \quad (21)$$

Under the condition $$m' \leq m_K \leq m_{K-1} \leq \ldots \leq m_1 \leq m, \quad (22)$$

the combined state described by (19) or (21) leads to a valid reduced-state trellis. For each code state, there are $2^{m_1 + \cdots + m_K}$ associated ISI states. Therefore, in the case of an S-state TCM encoder, the reduced combined trellis has $S \times 2^{m_1 + \cdots + m_K}$ states. From each combined state, $2^{m_1}$ transition groups originate, with each group consisting of $2^{m-m_1}$ parallel transitions.

Depending on the level of subset partitioning used for each symbol $a_{n-i}$ within the span of the channel memory, a variety of reduced-state trellises is obtained. For a given truncation length K, the least complex trellis has $S \times 2^{m'K}$ states. In this case, the sequence of subset labels associated with each code state specifies the same subsets as those used by the encoder. The most complex trellis has $S \times 2^{mK}$ states, which corresponds to the case where the subsets have been decomposed into individual data points.

The number of combined states can be reduced further if condition (22) is relaxed to $$0 < m_K < m' \leq m_{K-1} \leq \ldots \leq m_1 \leq m \text{ and } m' > 1 \quad (23)$$

The subset-label sequence then allows only to recover the encoder state at time $n - K + 1$, while only partial information about $\sigma_{n-K}$ is provided. Because $m_K < m'$, the label $Y'_{n-K}(m_K)$ describes a subset at a higher level than the depth specified by the TCM encoder. This leads to an additional set of reduced-state trellises, where, for given truncation length K, the least complex trellis now has $S \times 2^{m'(K-1) + m_K}$ states.

Decoding for a combined ISI and code trellis with subset states is accomplished by recursively computing the survivor metric corresponding to combined state $\lambda_{n+1}^K$ according to $$\tilde{M}_n(\lambda_{n+1}^K) = \quad (24)$$

$$\min\left\{ \tilde{M}_{n-1}(\lambda_n^K) + \left| z_n - \sum_{i=1}^{L} P_i \hat{a}_{n-i}(\lambda_n^K) - a_n \right|^2 \right\},$$

$$\{\lambda_n^K\} \rightarrow \lambda_{n+1}^K$$

where the minimization is taken over all trellis branches originating from states $\{\lambda_n^K\}$ and leading to successor state $\lambda_{n+1}^K$. Note that now all data-symbol estimates $\{\hat{a}_{n-i}(\lambda_n^K)\}$, $1 \leq i \leq L$, are taken from the past history associated with state $\lambda_n^K$. This modification, when $m_1 < m$, is necessary because combined subset states carry information about subsets rather than about individual data symbols.

Figure 3:
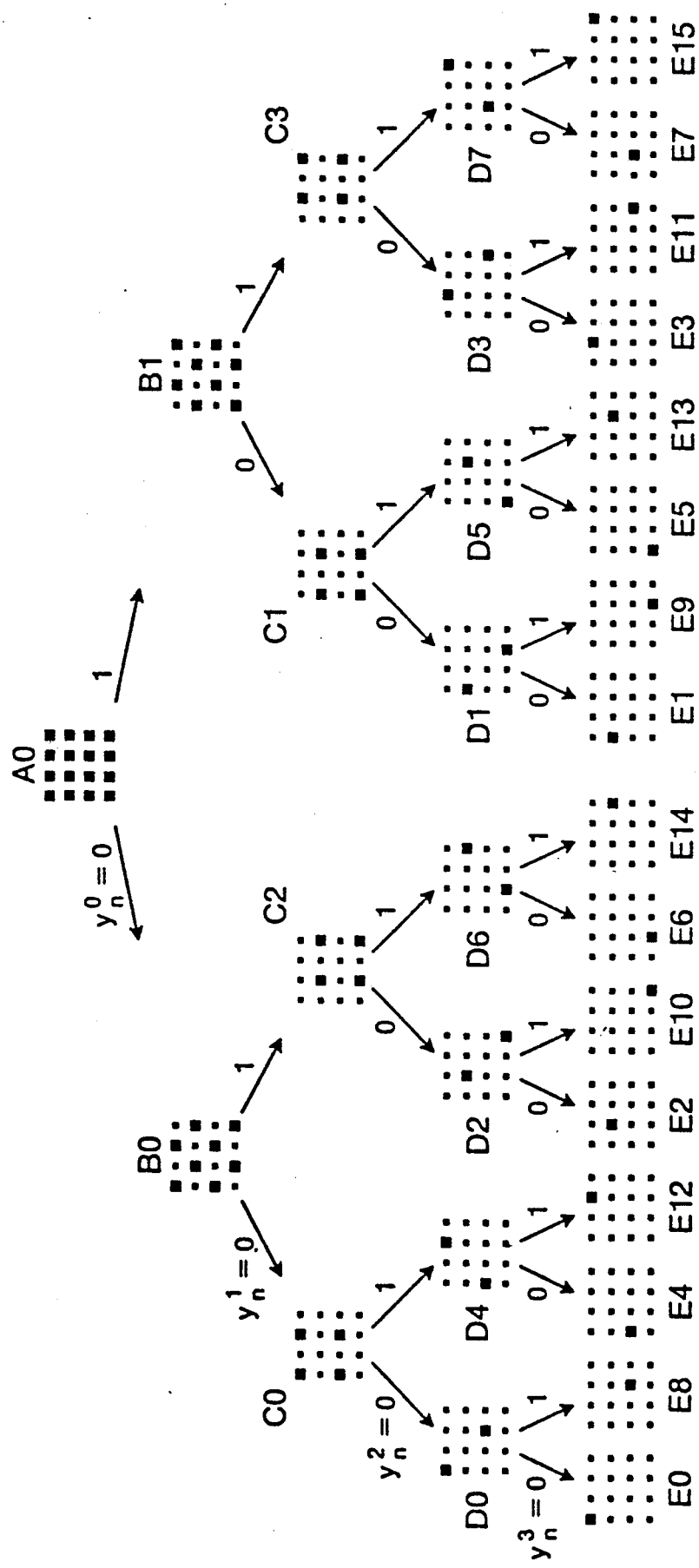
FIG. 3 depicts the set-partitioning for a 16-QASK signal constatation.

A specific example will now illustrate how the number of combined TCM and ISI states can be reduced systematically. We consider the transmission of $m = 3$ bits per T over a channel which spans $L = 5$ symbol intervals, with a TCM encoder which consisting of a four-state $LS = 4$ rate $m'/(m' + 1) = \frac{1}{2}$, convolutional encoder followed by a mapper which uses a 16-QASK signal constellation. The partition tree and the labeling of its branches for the 16-QUASK signal constellation are shown in FIG. 3.

Figure 4:
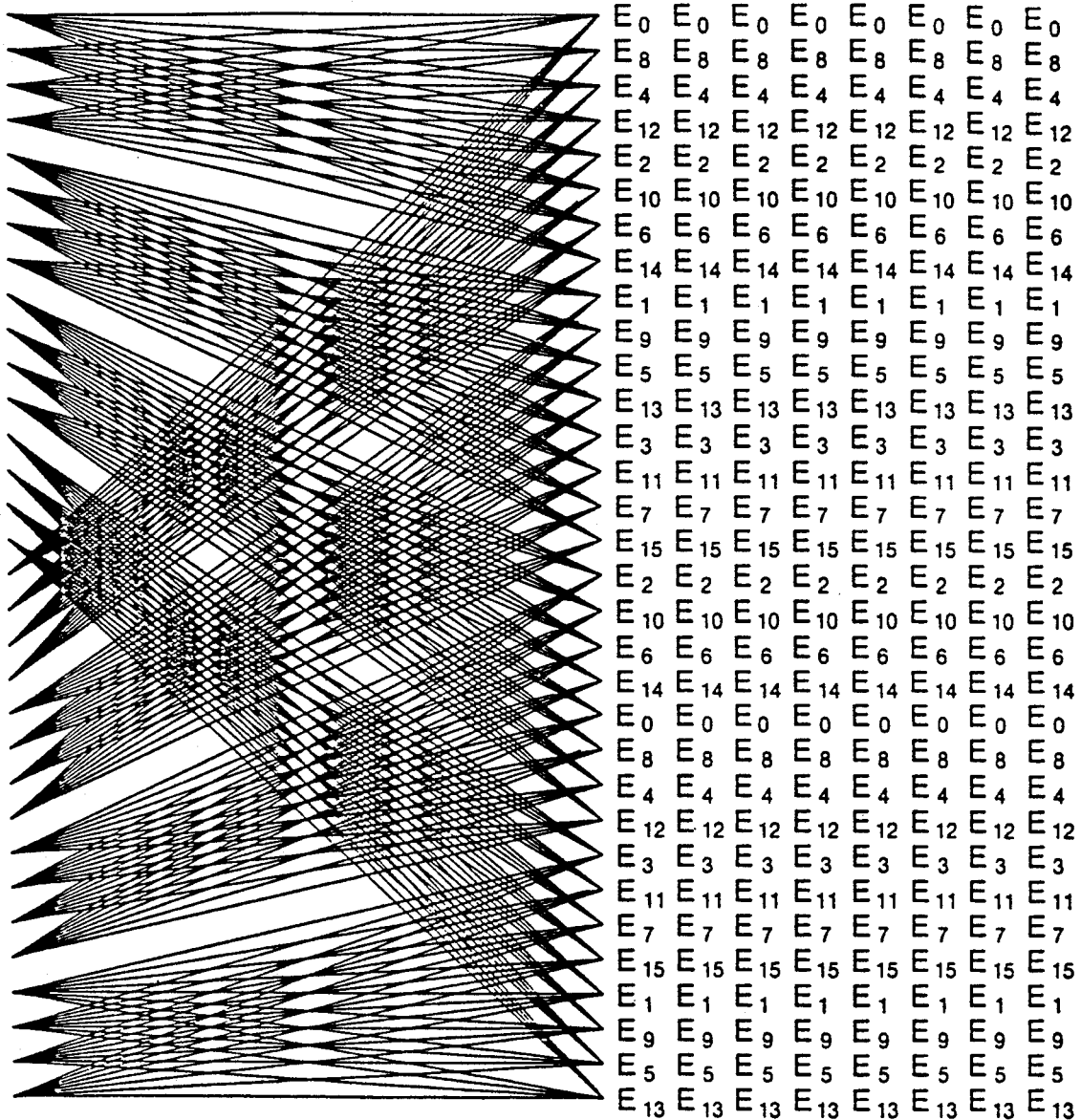
FIG. 4 is a schematic representation of a 32-state trellis using a first set of parameters.

Employing the optimum algorithm for decoding results in a trellis with $4 \times 8^5 = 2^{17}$ combined ISI and TCM states. The receiver complexity can be drastically reduced by truncating the memory to $K = 1$. This situation gives rise to a trellis with only 32 states as shown in FIG. 4. Eight transitions originate from each state, with each transition labeled by its corresponding single-point E-type subset. Decoding is accomplished by a recursive metric equation (16), which takes into account all $L = 5$ ISI terms, i.e., the branch metric subtracts estimates of the $L-K = 4$ ISI terms not represented by the combined TCM and ISI trellis.

Figure 5:
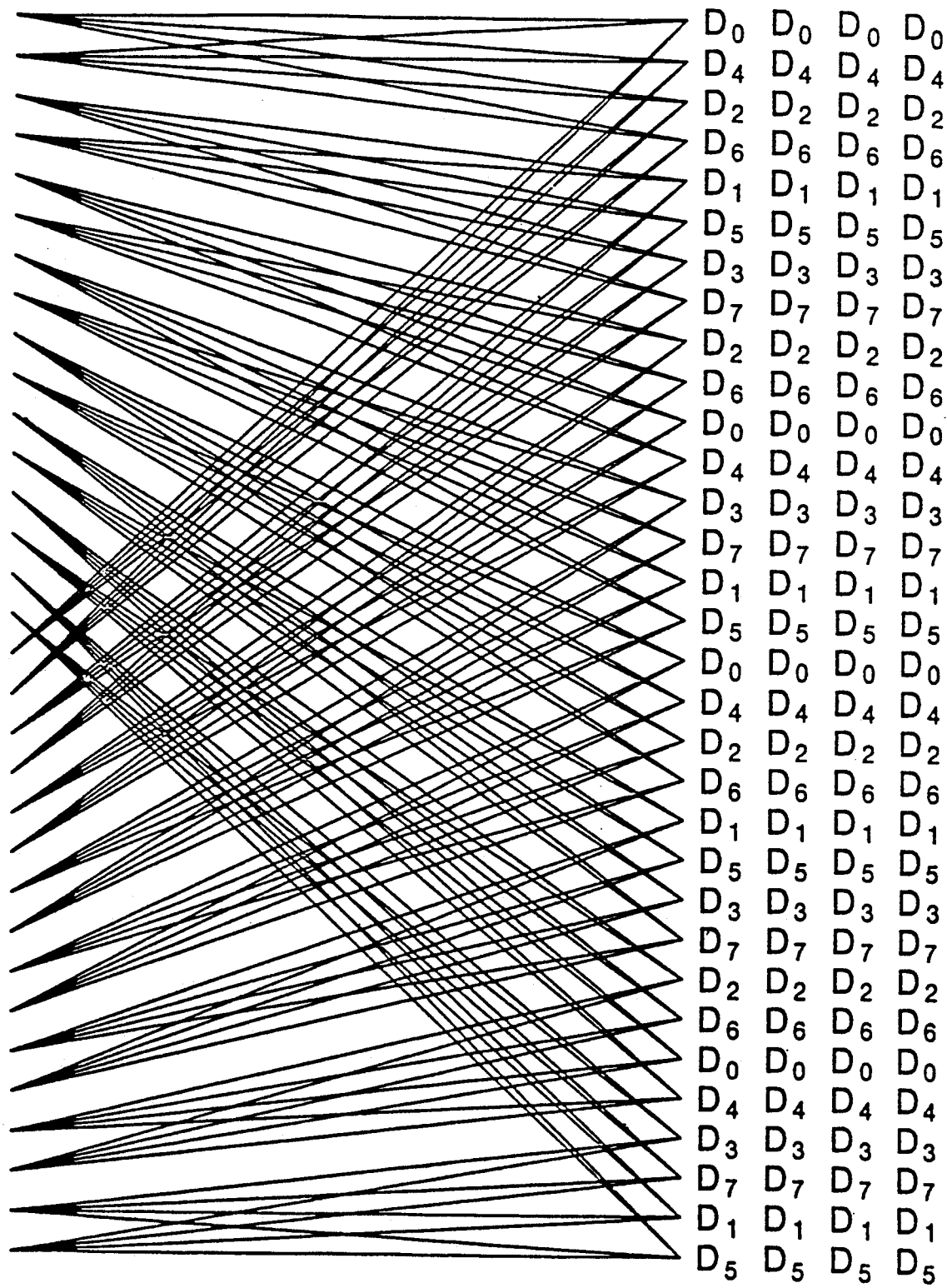
FIG. 5 is a schematic representation of a 32-state trellis using a second set of parameters.

In a situation where a significant fraction of the energy is concentrated in the first two channel coefficients, $P_1$ and $P_2$ of transversal filter 34 in FIG. 2, the terms that represent ISI in the combined-state description should be increased to $K = 2$, resulting in a trellis of $4 \times 8^2 = 2^8$ states. State complexity can be kept within manageable levels by using the above subset-state description. FIG. 5 shows a 32-state trellis with $S = 4$, $K = 2$, two $m_1 32$ 2 and $m_2 = 1$ where the ISI terms due to the two symbols $a_{n-1}$ and $a_{n-2}$ are represented by their D and C-type subsets, respectively. Note that four transition groups originate from each state, where each group consists of two parallel transitions labeled by their D-type subsets. Decoding of this trellis is accomplished by the metric equation (24).

Figure 6:
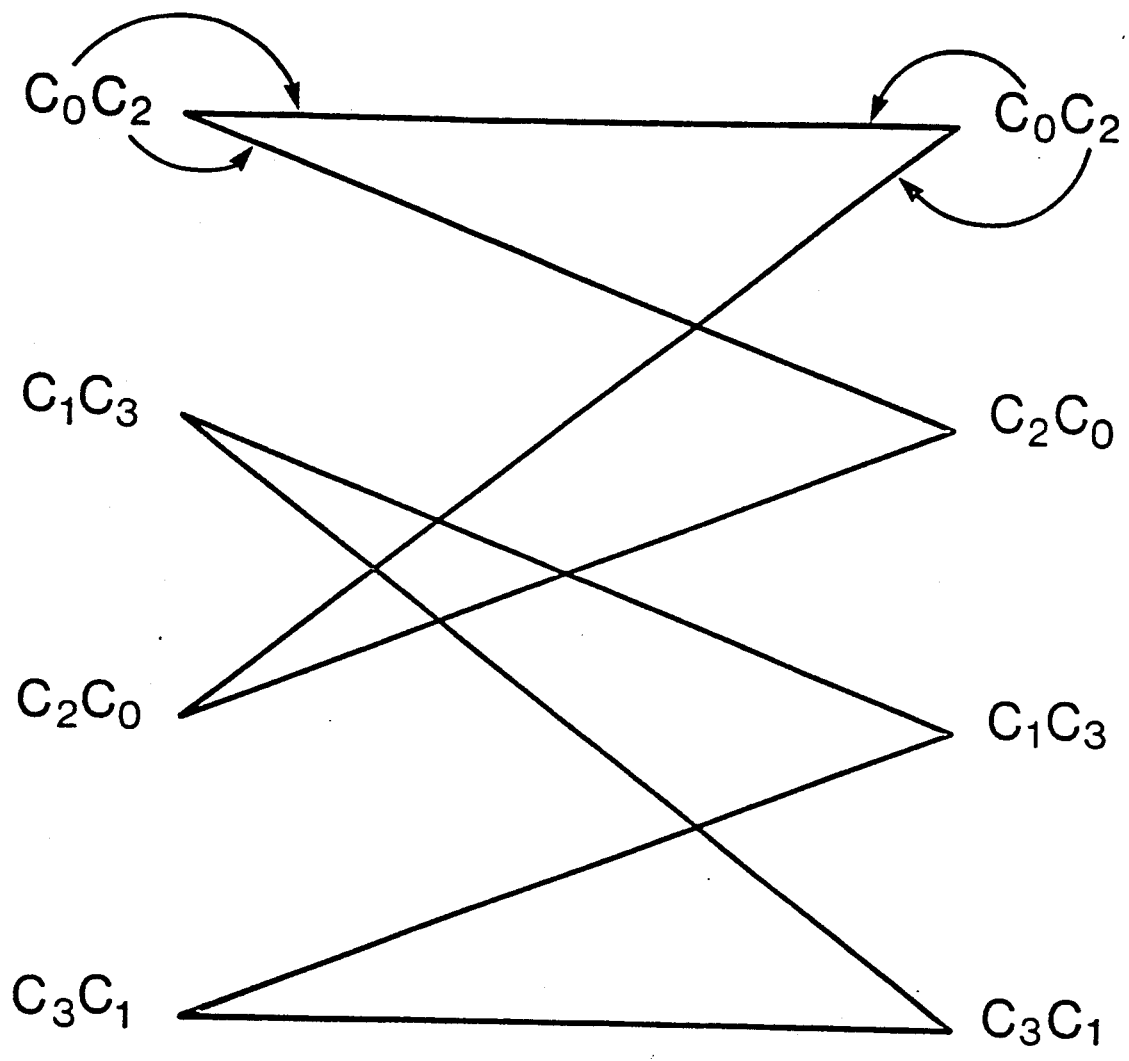
FIG. 6 is a schematic representation of a 4-state trellis.

Finally, the lowest complexity can be achieved by making $K = 0$. In this case, the decoder operates directly on the four-state code trellis of FIG. 6 where each branch is labeled with a C-type subset. Here, the metric computation of (17) is used, which cancels estimates of all $L = 5$ ISI terms.

IMPLEMENTATION OF THE ADAPTIVE MODEM RECEIVER

So far the channel and signal characteristics have been assumed to be known. In a realistic situation, however, the channel is usually unknown and slowly time-varying. Furthermore, other impairments such as carrier-frequency offset and carrier-phase jitter may affect receiver performance. In this section, an adaptive receiver is presented which simultaneously approximates the WMF, estimates the set of channel coefficients required in the metric calculation of the Viterbi decoder, and adjusts the carrier phase. The adaptive structure is capable of operating in both reference-directed and decision-directed modes.

It can be pointed out that the forward linear-filter section of an infinite length zero-forcing decision-feedback equalizer (DFE) is identical to the anticausal whitened-matched filted (WMF) employed for uncoded systems. Therefore, the forward section of a DFE is adopted here as an appropriate adaptive filter preceding the decoder. Being equivalent to a WCM, it suppresses the precursors of the channel impulse response and whitens the noise. The feedback coefficients can then be used in the branch-metric calculation of the combined TCM and ISI decoder.

Figure 7:
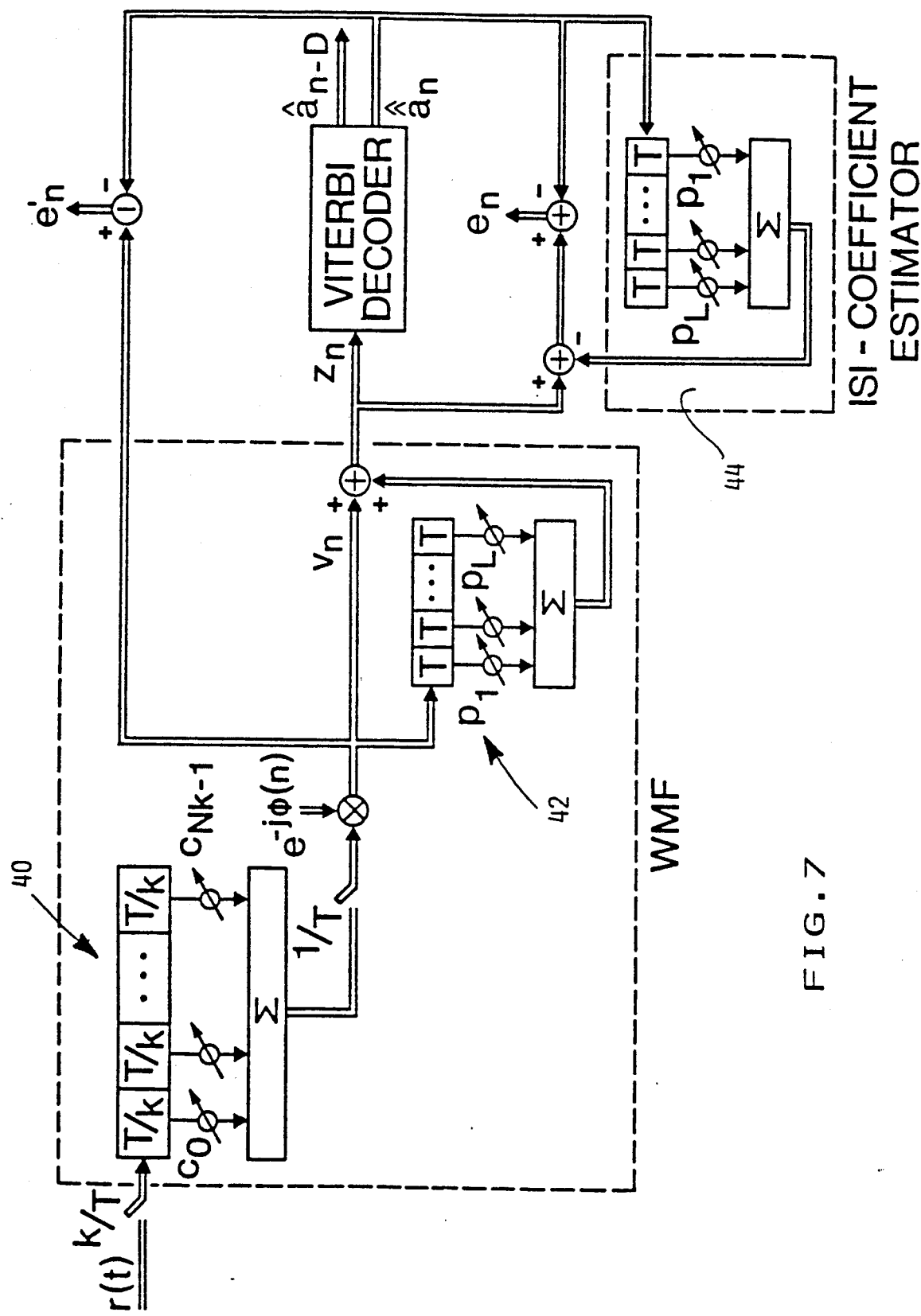
FIG. 7 is a block-diagram showing the part of the modem receiver incorporating the invention.

An adaptive modem receiver using the teachings of the invention is shown on FIG. 7. It consists of a minimum mean-squared error linear equalizer 40 with fractional-T spaced coefficients $\{C_i\}$ and a linear predictor 42 with coefficients $\{P_i\}$. The fact that this scheme represents an approximate WMF can be explained as follows. The linear equalizer first eliminates ISI in a mean-squared error sense. The predictor, operating as a whitening filter, subsequently whitens the noise and the residual ISI components of the equalized output signal. Being a finite impulse-response filter, the predictor reintroduces in a controlled fashion casusal ISI represented by the set of predictor-coefficients $\{P_i\}$ which will be used in the metric calculation of the Viterbi decoder.

Once per symbol interval, the equalizer output sample is multiplied with $e^{-j\phi(n)}$ to correct for carrier-phase offset, $\phi(n)$ being the phase estimate at symbol interval n, i.e., $$V_n = e^{-j\phi(n)} \sum_{i=0}^{N_k-1} c_i r_{nk-i}, \quad (25)$$

with Nk being the number of taps of the equalizer, and fed into the predictor. The predictor output is added to $v_n$, i.e., $$Z_n = V_n + \sum_{i=1}^{L} P_i V_{n-i}, \quad (26)$$

and the resulting value $z_n$ is fed into the Viterbi decoder.

The predictor-form WMF can be made adaptive by updating the equalizer coefficients $\{C_i\}$ and predictor coefficients $\{P_i\}$, using the error signal $$e'_n = v_n - \hat{a}_n \quad (27)$$

for adjusting the equalizer coefficients, and the prediction error $e_n$ which is obtained by using an ISI coefficient estimator 44 receiving the zero-delay tentative decision from the Viterbi decoder. Such and estimator 44 can be a transversal filter with the same coefficients as linear predictor 42.

$$e_n = Z_n - \sum_{i=1}^{L} P_i \hat{a}_{n-i} - \hat{a}_n = e'_n + \sum_{i=1}^{L} P_i e_{n-i} \quad (28)$$

The value $e_n$ is used for updating the predictor coefficients. Note that (28) describes the predictor operation as that of the whitening filter operating on the equalizer-error sequence $\{e'_n\}$. Depending on the mode of operation, estimates of past error samples, $e'_{n-i}$, $i=1,\ldots,L$, can be obtained either by using known reference symbols from a look-up table or by using zero-delay tentative decisions from the Viterbi decoder.

The equalizer and predictor coefficients as well as the phase estimate are thus adjusted by the gradient algorithms $$c_i(n+1) = c_i(n) - \alpha e^{j\phi(n)} e'_n r^*_{nk-i} \; i=0,1,\ldots,N_k-1 \quad (29)$$

$$P_i(n+1) = P_i(n) - \beta e_n e'^*_{n-i} \; i=1,2,\ldots,L, \quad (30)$$

$$\phi(n+1) = \phi(n) - \gamma Im(\hat{a}_n^* e_n), \quad (31)$$

where $\alpha, \beta, \}$ are adaptation parameters.

Now consider a reduced-state combined trellis with $S \times 2^{m_1 + \cdots + m_K}$ states, i.e., a subset-state trellis which retains $m_i$, $1 \leq, i \leq K$, bits of information for each ISI term as shown in equations (19) and (22). According to the above description, $2^{m_1}$ transition groups originate from each combined state, each group consisting of $2^{m-m_1}$ parallel transistions. Decoding of this subset trellis is accomplished by using the survivor-path metric in (24).

Expression (24) suggests decomposing the decoding process into four successive steps. First, ISI estimates are computed for all trellis states according to $$\hat{u}_n(\lambda_n^K) = \sum_{i=1}^{L} P_i a_{n-i}(\lambda_n^K), \quad (32)$$

where the decisions $\{\hat{a}_{n-i}(\lambda_n^K)\}$ are obtained from the decoder path memory associated with predecessor state $\lambda_n^K$. In a second step, the decoder determines, for each of the subsets originating from code states $\{\lambda_n^K\}$ the signal point $a_n$ which is closest in Euclidian distance to $Z_n - \hat{u}_n(\lambda_n^K)$. Thus, for every successor state $\lambda_{n+1}^K$ and for all $2^{m_1}$ subsets labeled $Y_{n-1}(m_1)$ leading to that state, the decoder computes the branch metric $$\Delta(\lambda_n^K, \lambda_{n+1}^K) = \min|z_n - \hat{a}_n(\lambda_n^K) - a_n|^2, \{a_n\} \quad (33)$$

where the minimum is taken over the $2^{m-m_1}$ signal points $\{a_n\}$ in the corresponding subset. This step resolves parallel transitions and yields $S \times 2^{2m_1 + \cdots + m_K}$ closest signal points and their associated branch metrics.

Decoding has therefore been reduced to finding the best path in a trellis with $S \times 2^{m_1 + \cdots + m_K}$ states and $2^{m_1}$ transitions per state using the survivor-path metric computation $$\tilde{M}_n(\lambda_{n+1}^K) = \min\{\tilde{M}_{n-1}(\lambda_n^K) + \Delta(\lambda_n^K, \lambda_{n+1}^K)\}, \{\lambda_n^K\} \rightarrow \lambda_{n+1}^K \quad (34)$$

where the minimum is taken over the $2^{m_1}$ branches originating from states $\{\lambda_n^K\}$ and leading to state $\lambda_{n+1}^K$. For each state $\lambda_{n+1}^K$, the symbol $\hat{a}_n(\lambda_{n+1}^K)$ corresponding to the survivor path with the minimum metric is stored into the path memory together with $\lambda_n^K$ indicating the corresponding predecessor state. The decoder now determines $$\tilde{M}_n^{opt} = \min\{\tilde{M}_n(\lambda_{n+1}^K)\} \{\lambda_{n+1}^K\} \quad (35)$$

yielding the state $\lambda^{opt}$ with the best metric. Finally, in a last step, a path decoder back-searches through the path memory starting from state $\lambda^{opt}$ and releases decision $\hat{a}_{n-D} = \hat{a}_{n-D}(\lambda^{opt})$ where D denotes the decoding delay. At the same time, tentative decision $\hat{a}_n = \hat{a}_n(\lambda^{opt})$ is released which is used for updating the WMF coefficients and the carrier phase mentioned above.

SIMULATION RESULTS

The error performance of a data-transmission system employing two-dimensional TCM and combined equalization and trellis decoding has been studied by computer simulation. The system transmits three information bits per data symbol using the subset partitioning of FIG. 4 and the four-state code trellis of FIG. 6. The receiver uses a predictor-form WMF which consists of a linear equalizer with 64 T/2-spaced coefficients and a predictor filter with L=5 coefficients. Equalizer and predictor coefficients are trained first by a reference-directed and then by a decision-directed gradient algorithm.

Figure 8:
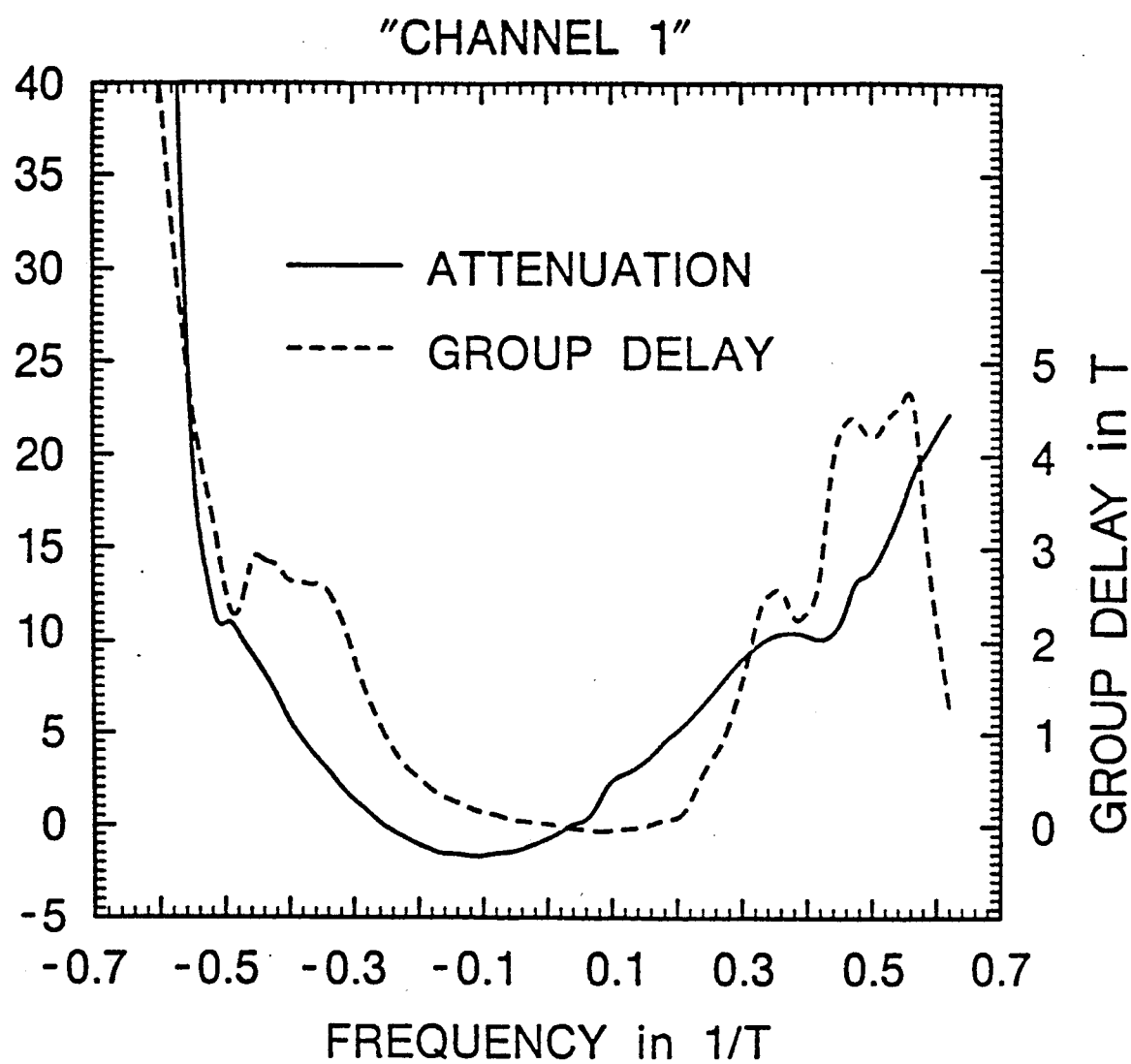
FIG. 8 is a graphical schematic representing the amplitude and group-delay characteristics for a first simulation example of the invention.
Figure 9:
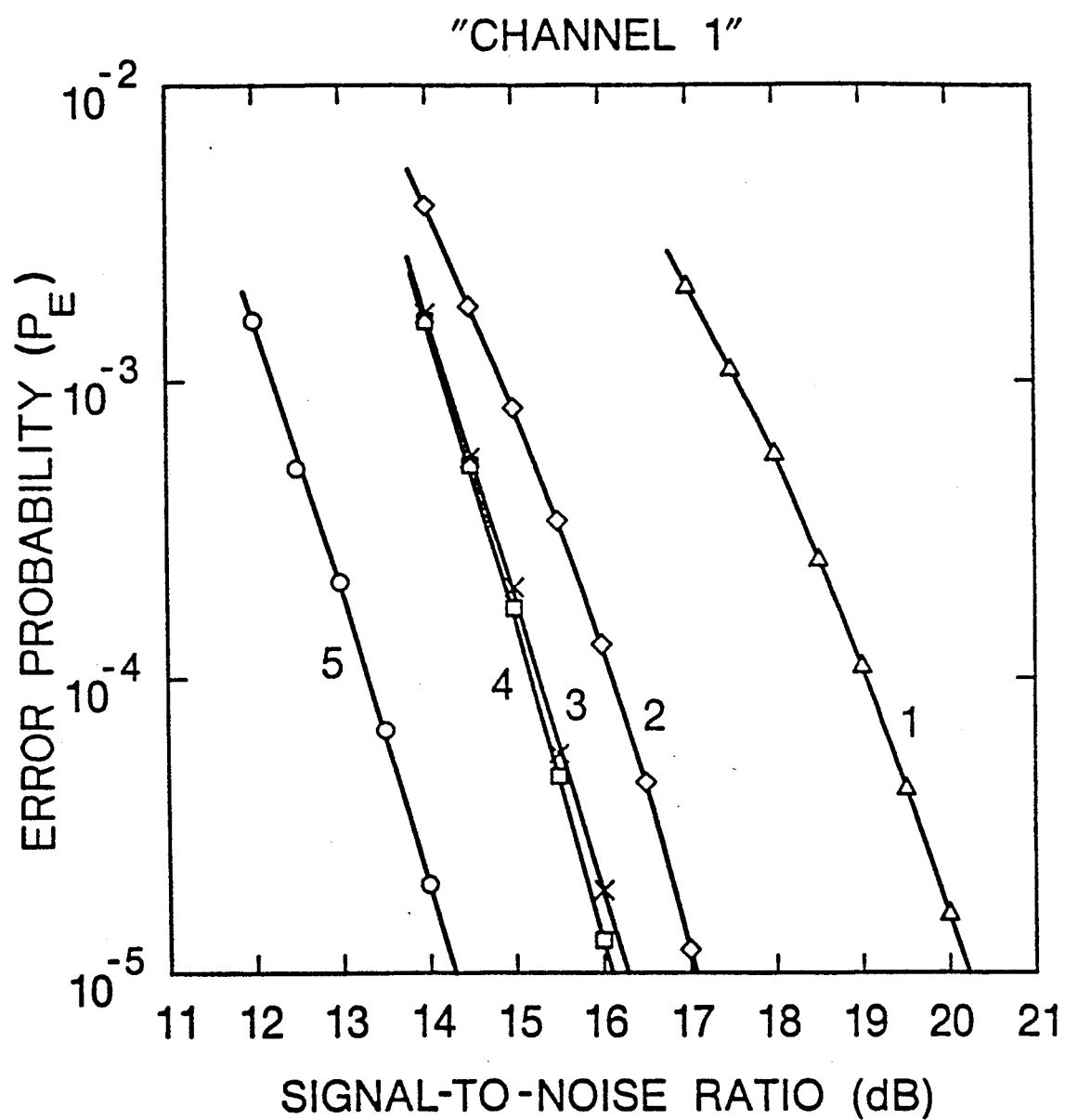
FIG. 9 is a graphical schematic representing the error-probability as a function of signal-to-noise ratio for the first simulation example.

Simulation results are first given for the simulated "Channel 1" whose amplitude and group-delay characteristics are illustrated on FIG. 8. FIG. 9 shows event-error probabilities as a function of the signal-to-noise ratio $SNR = E_s/N_O$, where $E_s$ is the symbol energy and $N_O$ the one-sided power spectral density of white Gaussian noise added after the channel.

Curve 1 gives the performance of a conventional receiver which uses a linear equalizer with 64 T/2-spaced coefficients followed by a separate four-state Viterbi decoder.

Curves 2-4 correspond to receivers using the predictor-form WMF and reduced-state decoder of various complexity. Curve 2 shows the case of full ISI-state truncation, where the Viterbi decoder operates directly on the four-state code-trellis using the metric computation of (17). Compared with curve 1, a gain in noise margin of 3.1 dB is obtained. Curve 3 corresponds to a 32-state decoder which operates on the combined ISI and code trellis of FIG. 4. Associated with each code state are eight ISI states corresponding to symbols transmitted at time n-1. Note that the metric computation of (16) is used so that ISI originating from intervals $n-2$, $n-3$, $n-4$, and $n-5$ is canceled by the metric computation. Compared with curve 2, an additional gain of 0.9 dB is obtained. Curve 4 shows the case of a 32-state decoder which operates on the combined trellis of FIG. 5. Associated with each code state are eight subset states for representing ISI from intervals $n-1$ and $n-2$. Here, the metric calculation of (24) suitable for combined subset states is used. Compared with curve 1, a gain of 4.1 dB is obtained. Finally, curve 5 gives a lower bound for all systems employing the four-state encoder. It was obtained with a channel which has no amplitude and phase distortion.

Figure 10:
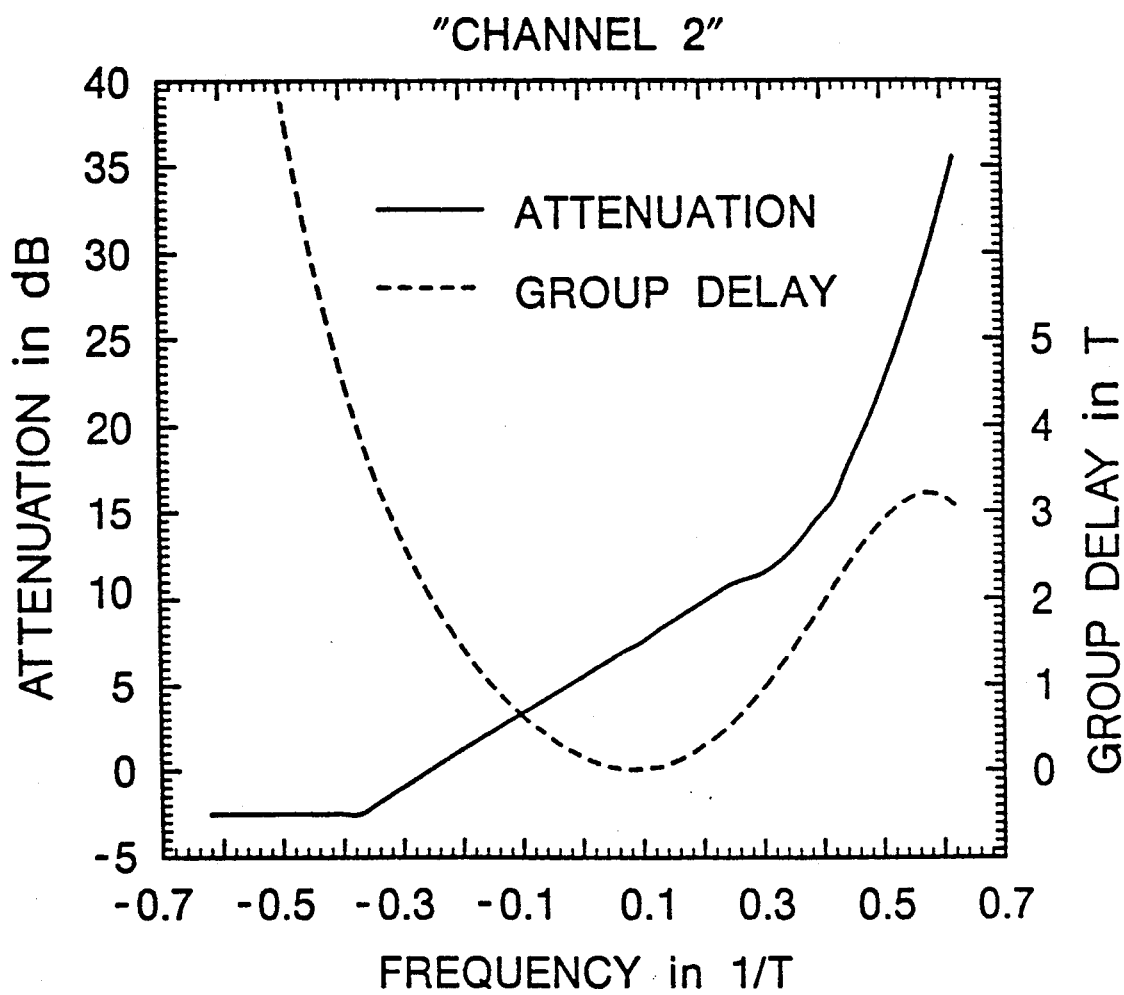
FIG. 10 is a graphical schematic representing the amplitude and group delay characteristics for a second simulation example of the invention.
Figure 11:
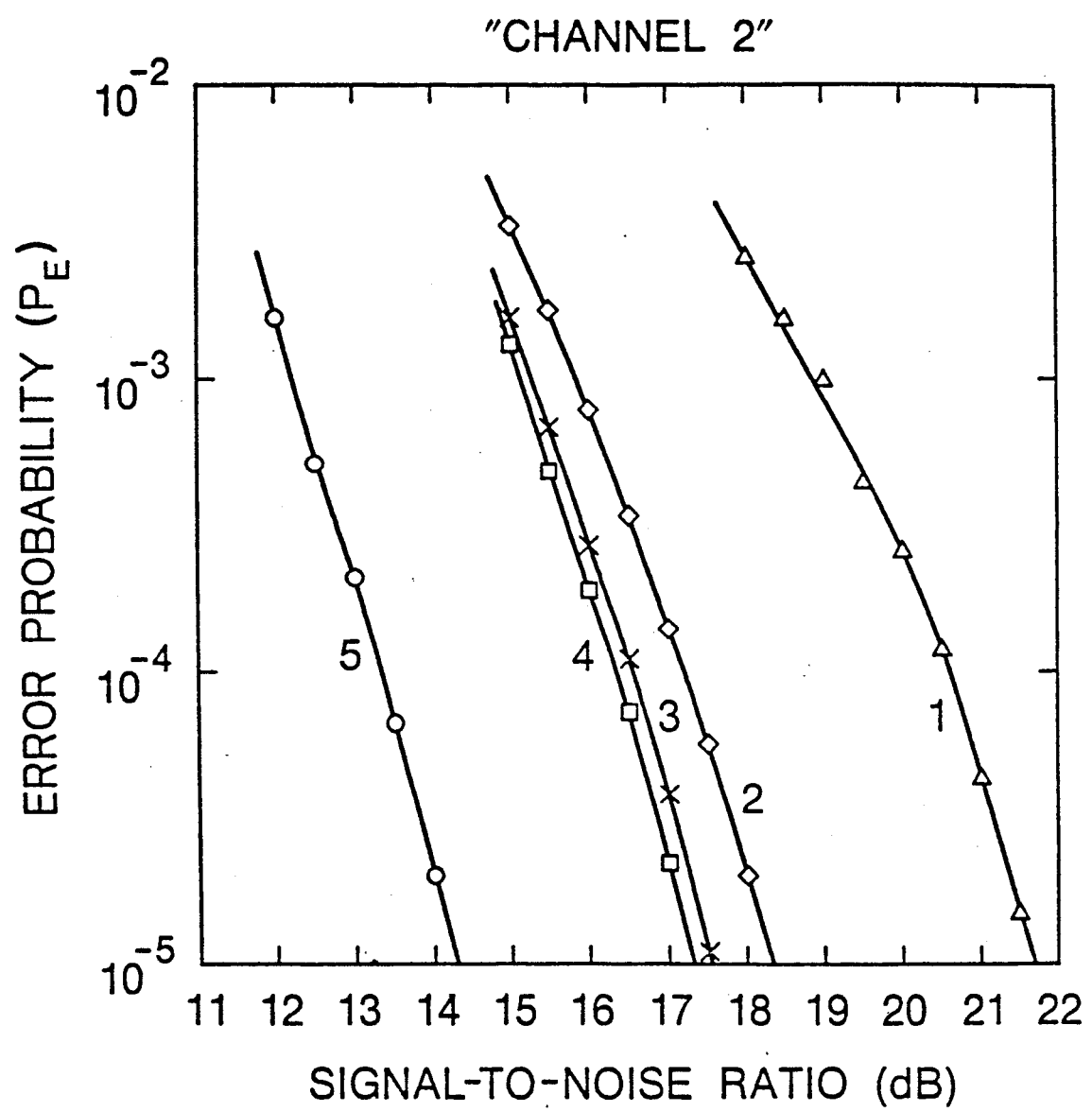
FIG. 11 is a graphical schematic representing the error-probability as a function of signal-to-noise ratio for the second simulation example.

Simulation results have also been obtained for "Channel 2" shown in FIG. 10, which has substantially larger amplitude distortion. Curve 1 in FIG. 11 again shows the error performance of a conventional receiver with linear equalization. Using whitened-matched filtering with four-state decoding and the metric of (17), a gain in noise margin of 3.3 dB is achieved. The 32-state decoder of FIG. 5 which employs subset states corresponding to ISI from intervals $n-1$ and $n-2$ (curve 4) gains an additional 0.2 dB, bringing the total gain in noise margin with respect to curve 1 to 4.3 dB. Curve 5 provides the lower bound for all systems employing four-state TCM.

Figure 12:
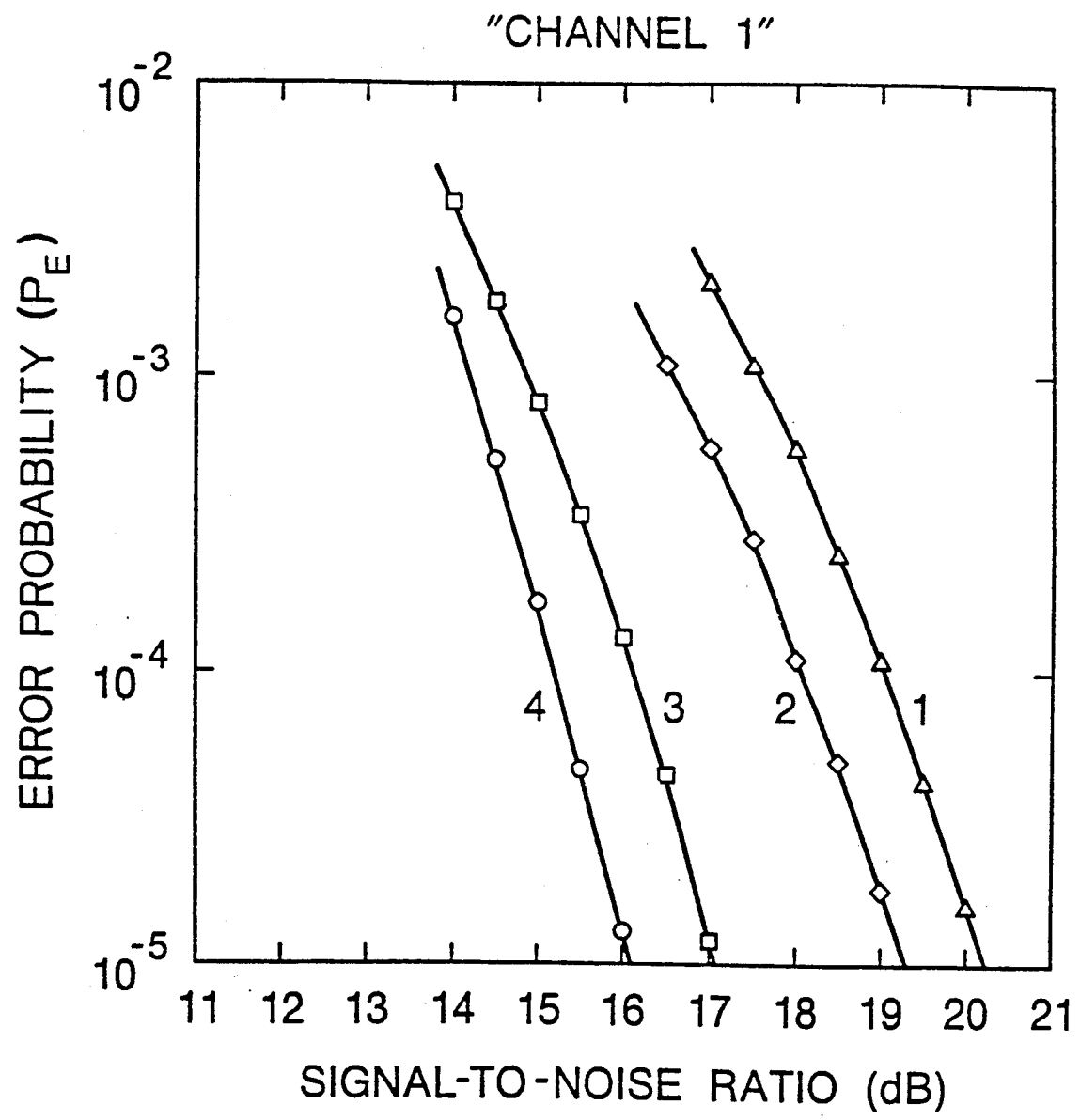
FIG. 12 is a graphical schematic representing the error-probability as a function of signal-to-noise ratio when different equalizers are used.

Finally, it is of interest to compare the performance of a receiver with combined equalization and trellis decoding with that of a receiver which employs decision-feedback equalizer in front of the TCM decoder. The predictor-form equalizer used here which consists of a linear equalizer with 64 T/2-spaced coefficients and a five-tap predictor. zero-delay tentative decisions obtained from the TCM decoder are used for estimating the ISI due to past symbols. FIG. 12 shows the simulation results obtained for "Channel 1". The receiver with a decision-feedback equalizer (curve 2) is found to perform only 1.0 dB better than the conventional receiver with linear equalization cannot significantly improve the performance of a TCM system because ISI due to past decisions is not canceled reliably. In contrast, combined equalization and trellis decoding with four states (curve 3) and 32 states (curve 4) performs better than separate linear equalization and TCM decoding by 3.1 and 4.1 dB, respectively.

In conclusion an adaptive receiver structure for decoding trellis-encoded signals in the presence of ISI and noise has been presented. The receiver employs an adaptive WMF and a reduced-state Viterbi decoder which operates on a subset of combined ISI and code states. The decoder uses a modified branch metric which cancels ISI terms that are not represented by the reduced-state trellis. Furthermore, a systematic procedure has been given which uses the set-partitioning principles inherent in TCM for obtaining reduced-state combined ISI and code trellises. This approach gives rise to a family of Viterbi decoders that offer a trade-off between decoder complexity and performance.

Simulation results for channels with realistic amplitude and phase distortion were used to demonstrate that the proposed receiver achieves a substantial gain in noise margin over a conventional receiver which uses separate linear equalization and TCM decoding. A significant gain is already obtained by employing the least complex Viterbi decoder that operates directly on the TCM code trellis. Additional performance improvements are achieved by using the subset-state concept at the expense of increased decoder complexity.

However, while a preferred embodiment of the invention has been described, variations and modifications can be made without departing from the spirit and scope of the invention.

We claim:

1. A fully adaptive modem receiver having a receiver-filter providing an output signal r(t) in response to an input signal received from a telephone line and, comprising:

a whitened matched filter having a fractional-tap spacing equalizer, said fractional tap-spacing equalizer receiving as inputs sample values obtained by sampling said receiver-filter output signal r(t) at rate k/T, where T denotes the symbol interval and k>1 is a small integer, each tap having a coefficient $C_i$, i being an integer in the range from 0 to $Nk-1$ where N is the length of the equalizer delay line in symbol intervals, said equalizer providing an equalizer output value at each symbol interval n;

an adaptive carrier-phase tracking means connected to the output of said equalizer for providing a phase estimate output signal $\phi(n)$ for compensating for the carrier-phase error in said equalizer output signal, said error resulting from phase jitter and frequency offset, and also providing a carrier-phase error compensated output signal value $V_n$ in each symbol interval n, a linear predictor receiving the output signal values $V_n$ from said adaptive carrier-phase tracking means and having coefficients $P_i$ where i is an integer in the range from 1 to L, said linear predictor providing, in response to said output signal values $V_n$ for L symbol intervals, a predictor output value according to the relation $$\sum_{i=1}^{L} P_i \cdot V_{n-i}$$

and an adder for adding at each symbol interval n said predictor output value to said value $V_n$ and providing a resulting output signal $Z_n$, whereby the noise present in said output signal $Z_n$ is whitened regardless of whether the additive channel noise is correlated or not, and whereby said output signal contains intersymbol interference;

a sequence decoder having ISI cancellation means for determining the symbol sequence closest in Euclidian distance to the samples of said resulting output signal $Z_n$ provided at the input of said decoder after subtracting ISI estimates provided by said ISI cancellation means, and providing a zero-delay tentative decision $\hat{a}_n$ in each symbol interval n, and also providing in each symbol interval a final decision $\hat{a}_{n-D}$ with a delay of D symbol intervals as the final result; and an ISI coefficient estimator having also said coefficients $P_i$ providing in response to the zero-delay tentative decision $\hat{a}_{n-i}$ taken at the symbol interval n-i where i is an integer in the range from 1 to L an ISI coefficient estimator output value according to the relation $$\sum_{i=1}^{L} P_i \cdot \hat{a}_{n-i};$$

and adapting means which, in response to said ISI estimator output value, said sequence decoder input signal $Z_n$, and said zero-delay tentative decision from said sequence decoder, provides an error signal $e_n$ for updating the coefficients of said linear predictor; and adjusting means which, in response to said carrier-phase error compensated signal $V_n$ and to said zero-delay tentative decision from said sequence decoder, provides an error signal $e'_n$ for adjusting the coefficients of said franctional-tap spacing equalizer.

2. A modem receiver according to claim 1, wherein: said adapting means provides a prediction error estimate signal $e_n$ according to the relation $$e_n = Z_n - \sum_{i=1}^{L} P_i \cdot a_{n-i} - a$$

for updating the coefficients $P_i$.

3. A modem receiver according to claim 1, wherein: said adjusting means provide an error signal $e'_n$ according to the relation $$e'_n = V_n - a_n$$

for adjusting the coefficients of said fractional-tap spacing equalizer.

4. A modem receiver according to claim 1 or 2 or 3, wherein:
said input signal received from a telephone line originates from a remote transmitting system employing a Trellis-Coded Modulation (TCM) encoder and said sequence decoder is a Viterbi decoder which performs maximum likelihood sequence decoding for determining the coded data bit sequence closest in Euclidian distance to samples at the input of said decoder.

5. A modem receiver according to claim 4, wherein: at the symbol interval n+1 the coefficient $C_i$ of said franctional-tap spacing equalizer, the coefficient $P_i$ of said linear predictor, and the phase estimate $\phi$ to compensate for said carrier-phase error, are produced as a function of said input sample values, said prediction error e said error signal e' said estimate $\phi$, and said zero-delay tentative decision signal $a_n$, at the symbol interval n are such that $$C_i(n + 1) = C_i(n) - \alpha \exp J\phi(n) \cdot e'_n \cdot r_{nk-1}*$$
(i from 0 to $N_k - 1$)

$$P_i(n + 1) = P_i(n) - \beta e_n \cdot e'_{n-1}*$$
($i = 1, 2 \ldots L$)

$$\phi(n + 1) = \phi(n) - \gamma \cdot I_m(\hat{a}_n^* \cdot e_n)$$

with $\alpha$, $\beta$, $\gamma$ being adaptation parameters.

6. A modem receiver according to claim 5 wherein: said sequence decoder is a reduced-state decoder operating on a sub-trellis which is built by employing channel-truncation to K terms with $0 \leq K \leq L$, and enabling the intersymbol interference (ISI) to be cancelled by said ISI-cancellation means by subtracting at the instant n, ISI terms that are not or are only partially represented by the reduced combined states $\lambda_n^K$ of the Viterbi algorithm.

7. A modem receiver according to claim 6, wherein: said reduced-state decoder utilizes a subset-state trellis which retains $m_i$ bits of information for each ISI terms with $1 \leq i \leq K$, said decoder comprising:
intersymbol interference estimating means for providing ISI estimates $\hat{U}_n(\lambda_n^K)$ for all trellis states as a function of symbol estimates $\hat{a}_n(\lambda_n^K)$ according to the relation $$\hat{U}_n(\lambda_n^K) = \sum_{i=1}^{L} P_i \cdot \hat{a}_{n-1}(\lambda_n^K);$$

and subset decoder means for determining, for each of the subsets originating from states $\lambda_n^K$, the signal point $\hat{a}$ which is closest in Euclidian distance to $Z_n - \hat{U}_n\lambda_n^K$), and trellis path means for determining the best path in the trellis resulting in an optimum state $\lambda^{opt}$, by using the survivor-path metric computation; and path decoder means responsive to said state $\lambda^{opt}$, for determining a final decision $\hat{a}_{n-D}$, where D denotes the decoding delay.

8. A modem receiver according to claim 7, wherein: said subset decoder means determines, for every successor state $\lambda_{n+1}^K$ of state $\lambda_n^K$, and for all $2^{m_1}$ subsets leading to that state, the branch metric according to the relation $$\Delta(\lambda_n^K, \lambda_{n+1}^K) = \min |Z_n - \hat{U}_n(\lambda_n^K) - a_n|^2$$

where the minimum is taken over the $2^{m-m_1}$ signal points ($a_n$) in the corresponding subset.

9. A modem receiver according to claim 8, wherein: said trellis path means determines the best path in a trellis having
$S \cdot 2^{m_1 + \cdots m_K}$ where S is the number of said trellis-coded-modulation states of encoder which has transmitted the signals,
and $2^{m_1}$ transitions per state using the survivor-path metric computation.

10. A modem receiver according to claim 9, wherein: said path decoder means, further to determining a final decision $\hat{a}_{n-D}$, also provides said zero-delay tentative decision $\hat{a}_n$ which is the symbol estimate corresponding to said optimum state at the instant n.

* * * * *